(12) United States Patent
Helmick et al.

(10) Patent No.: US 10,109,974 B2
(45) Date of Patent: Oct. 23, 2018

(54) VIBRATING PALLET SYSTEM FOR AUTOMATED WIRE INSERTION

(71) Applicant: THE BOEING COMPANY, Chicago, IL (US)

(72) Inventors: Eerik J. Helmick, Seattle, WA (US); Bradley J. Mitchell, Snohomish, WA (US)

(73) Assignee: THE BOEING COMPANY, Chicago, IL (US)

( * ) Notice: Subject to any disclaimer, the term of this patent is extended or adjusted under 35 U.S.C. 154(b) by 271 days.

(21) Appl. No.: 15/010,525

(22) Filed: Jan. 29, 2016

(65) Prior Publication Data

US 2017/0222387 A1 Aug. 3, 2017

(51) Int. Cl.
*H01R 43/20* (2006.01)
*H01R 43/28* (2006.01)
*H01R 33/90* (2006.01)
*H01R 39/64* (2006.01)
*H01L 41/053* (2006.01)

(52) U.S. Cl.
CPC ............ *H01R 43/20* (2013.01); *H01R 33/90* (2013.01); *H01R 43/28* (2013.01); *H01L 41/053* (2013.01); *H01R 39/64* (2013.01); *Y10T 29/42* (2015.01); *Y10T 29/49174* (2015.01); *Y10T 29/53209* (2015.01); *Y10T 29/53213* (2015.01); *Y10T 29/53243* (2015.01)

(58) Field of Classification Search
CPC ........ H01R 43/20; H01R 43/28; H01R 33/90; H01R 39/64; Y10T 29/42; Y10T 29/49174; Y10T 29/53209; Y10T 29/53213; Y10T 29/53243; H01L 41/053
See application file for complete search history.

(56) References Cited

U.S. PATENT DOCUMENTS

| 4,727,637 | A | 3/1988 | Buckwitz et al. |
| 5,989,065 | A | 11/1999 | Lazaro, Jr. |
| 7,406,764 | B2* | 8/2008 | Takayama ......... Y10T 29/53213 29/33 F |
| 7,661,980 | B2 | 2/2010 | Dietrich et al. |
| 9,263,840 | B1 | 2/2016 | Lazaro, Jr. et al. |
| 9,300,104 | B1 | 3/2016 | Lazaro, Jr. et al. |
| 2007/0006449 | A1* | 1/2007 | Yamanashi ............ H01R 43/20 29/748 |
| 2010/0327703 | A1* | 12/2010 | Uetani .................... Y10T 29/42 310/364 |

(Continued)

FOREIGN PATENT DOCUMENTS

JP 2012109382 A * 6/2012

*Primary Examiner* — A. Dexter Tugbang
(74) *Attorney, Agent, or Firm* — Patterson + Sheridan, LLP

(57) ABSTRACT

A wire insertion system includes a fixture, a first vibrating element connected to the fixture, and a gripper adapted to interface with the fixture and to support a plurality of wires, in which the gripper includes a body, at least one gripping member coupled to the body, and a second vibrating element connected to the gripper. The wire insertion system further includes a sensor coupled to the fixture, and a controller coupled to the sensor and in communication with the first vibrating element, the second vibrating element, and the gripper, and configured to vibrate the first vibrating element and the second vibrating element using signals from the sensor.

6 Claims, 3 Drawing Sheets

(56) References Cited

U.S. PATENT DOCUMENTS

2013/0025346 A1\* 1/2013 Senkoji ................ G01V 13/00
 73/1.38
2017/0070021 A1 3/2017 Helmick
2017/0308068 A1 10/2017 Helmick et al.

\* cited by examiner

VIBRATING PALLET SYSTEM FOR AUTOMATED WIRE INSERTION

BACKGROUND

Field

The present disclosure generally relates to automated wire insertion systems for manufacturing processes, such as aircraft or electronics manufacturing. More specifically, the present disclosure generally relates to a system and method for the insertion of a wire into a fixture using vibratory motion.

Description of the Related Art

Typical wire insertion automation machines require very tight tolerances between the expected (programmed) grommet cavity location and the actual position when mounted to the pallet. Currently, connectors are attached to the pallet by a rigid threaded fixture that aligns the connector by its outer shell or with a connector friction post. The tolerance stack up of the connector manufacturer, however, may place the connector cavity locations outside of the tolerance of the programmed positions of the automated wire insertion machine, thus causing misalignments and/or high failure rates. Automated wire insertion machines have high failure rates due to the collisions between the wire contact and the grommet or dielectric face of the connector. Many of these wire insertion failures are attributed to the interference fit and high friction of the contact in the compliant grommet material.

As such, there may be a misalignment between the master key on the connector shell and the grommet cavity holes. Other misalignments may occur due to a translational error of the grommet within the shell as the grommet is glued into the connector by hand. Shifting of the grommet frequently occurs despite the grommet being self-centered by design.

The tolerance stack up of the connector part induces numerous wire insertion failures with the use of an automated wire insertion machine. The grommet of many connectors is an interference fit with the wire contact. Furthermore, the insertion gripper grabs the wire which is less rigid than the contact. The lack of rigidity in the wire makes fully seating the wire in the connector difficult. Once a wire contact has been positioned through the grommet, the wire contact must find its way into the dielectric cavity, which is rigid. If the wire contact and the dielectric cavity are not perfectly aligned, numerous insertion failures may occur. Some current automated wire insertion machines have a certain number of programmed retries if the sensor recognizes a failed insertion. These retries allow the wire contact to back up and try a slightly different position for the next wire insertion. The insertion attempts may form a circular array about the original attempt location. The high friction in the grommet makes it difficult to effectively move the contact to locate the dielectric hole. Furthermore, multiple failed attempts are time consuming and oftentimes slow production as hundreds or thousands of wires may be required to be inserted in a given system.

Therefore, what is needed in the art is a system and method for effectively and efficiently inserting a wire into a fixture.

SUMMARY

Examples disclosed herein generally relate to methods and apparatus for the insertion of one or more wires into a cavity of a fixture of a structure or component. The wire insertion apparatus includes a grommet, a gripper adapted to interface with the grommet, and at least a first vibrating element. The first vibrating element is connected to and vibrates one or more of the apparatus, the grommet, the gripper, the wire, and/or a component of the apparatus. Vibration, induced in any direction, enables the cavities to shift position during insertion relative to the contact, thus increasing the tolerance of the cavity, reducing the failure rate of wire insertion, and reducing total production time. The vibration breaks the static friction of the contact in the grommet or dielectric opening, creates the positive locating required to insert the contact in the grommet and/or dielectric, and/or pivots the contact.

In one example, a wire insertion system is disclosed. The wire insertion system includes a fixture, a gripper adapted to interface with the fixture and to support a plurality of wires, and a first vibrating element. The wire insertion system further includes a sensor and a controller. The first vibrating element is connected to one or more of the fixture or the gripper. The sensor is coupled to the fixture. The controller is coupled to the sensor and in communication with the first vibrating element and the gripper, and configured to vibrate the first vibrating element using signals from the sensor.

In another example, a wire insertion system is disclosed. The wire insertion system includes a fixture, a first vibrating element connected to the fixture, and a gripper adapted to interface with the fixture and to support a plurality of wires. The wire insertion system further includes a sensor coupled to the fixture, and a controller. The gripper includes a body, at least one gripping member connected to the gripper, and a second vibrating element connected to the gripper. The controller is coupled to the sensor and in communication with the first vibrating element, the second vibrating element, and the gripper, and is configured to vibrate the first vibrating element and the second vibrating element using signals from the sensor.

In another example, a method for inserting a wire into a receptacle is disclosed. The method includes coupling the wire to a movable gripping device, positioning the wire relative to a cavity in the receptacle, and vibrating one or more of the moveable gripping device or the receptacle. The method further includes inserting the wire into the cavity in the receptacle while vibrating, measuring a change in the vibrating provided to the receptacle versus the vibrating received by the receptacle, and optimizing the vibrating.

DETAILED DESCRIPTION

Examples disclosed herein generally relate to methods and apparatus for the insertion of one or more wires into a cavity of a fixture of a structure or component. The wire insertion apparatus includes a grommet, a gripper adapted to interface with the grommet, and at least a first vibrating element. The first vibrating element is connected to and vibrates one or more of the apparatus, the grommet, the gripper, the wire, and/or a component of the apparatus. Vibration, induced in any direction, enables the cavities to shift position during insertion relative to the contact, thus increasing the tolerance of the cavity, reducing the failure rate of wire insertion, and reducing total production time. The vibration breaks the static friction of the contact in the grommet or dielectric opening, creates the positive locating required to insert the contact in the grommet and/or dielectric, and/or pivots the contact.

Figure 1A:
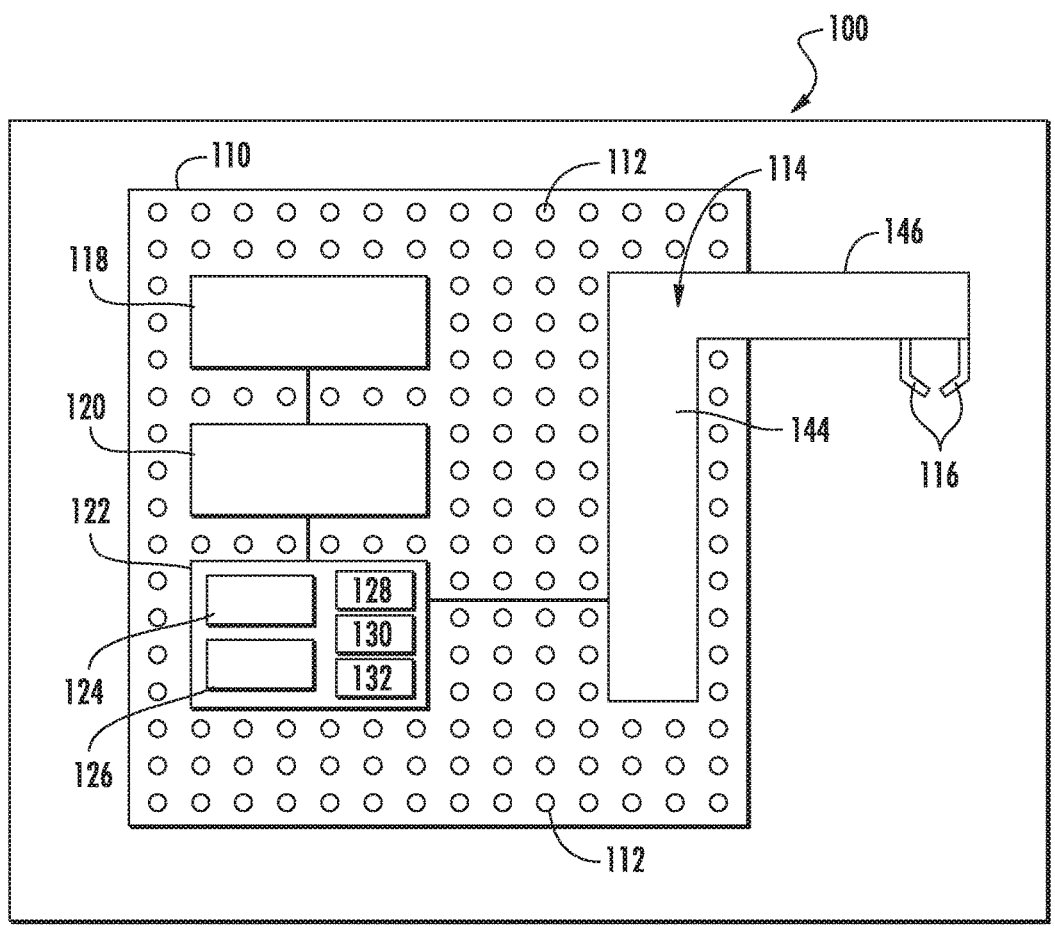
FIG. 1A schematically illustrates a wire insertion system, according to one example.
Figure 1B:
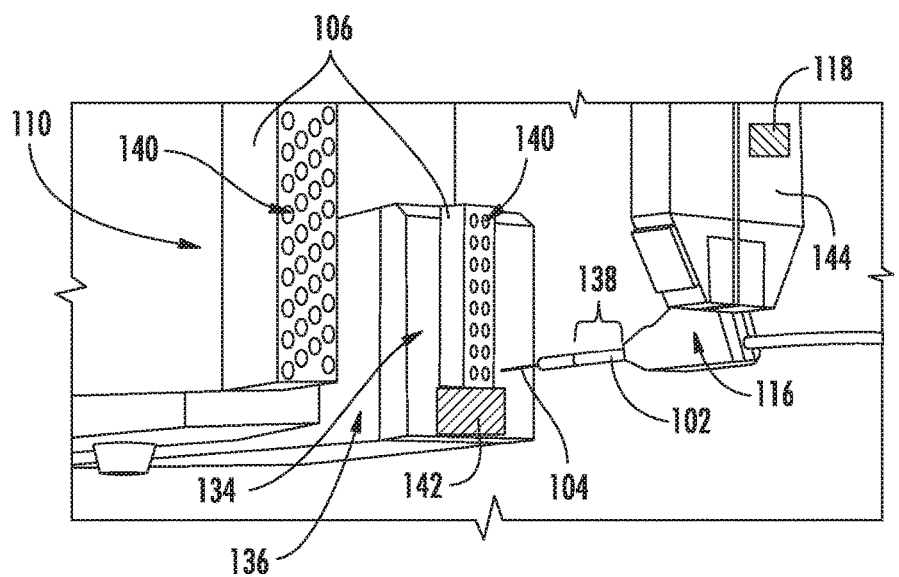
FIG. 1B schematically illustrates a perspective view of the gripper and receptacle of the wire insertion system of FIG. 1A, according to one example.
Figure 1C:
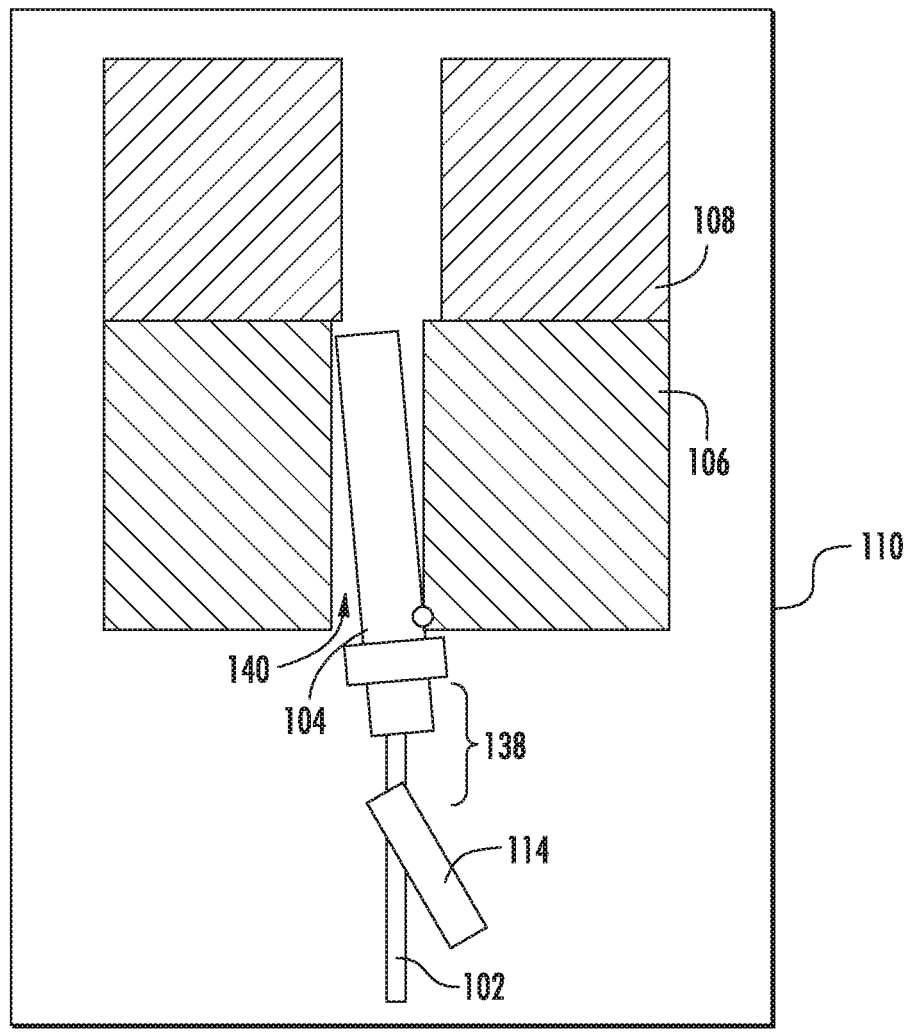
FIG. 1C schematically illustrates a cross sectional view of a cavity in the grommet and dielectric of the wire insertion system of FIGS. 1A and 1B, according to one example.

FIGS. 1A and 1B schematically illustrate a wire insertion system 100 for coupling a contact 104 of a wire 102 with a grommet 106 and/or a dielectric 108 (shown in FIG. 1C). The wire insertion system 100 includes a fixture 110. The fixture 110 is a support, base, housing, and/or mount for providing support to system components. In some examples, the fixture 110 may be a pallet or a connector. In some examples, the fixture 110 may include a plurality of holes 112 bored therethrough. The holes 112 may be, for example, screw holes or pin holes for receiving a screw or pin, thus coupling a system component to the fixture 110. The fixture 110 may comprise a metal material, a plastic material, a rubber material, and/or another suitable material.

The wire insertion system 100 also includes a gripper 114. In some examples, the gripper 114 is an insertion gripper configured to support a plurality of wires 102 to insert the plurality of wires 102 into a cavity. The gripper 114 is coupled to the fixture 110. The gripper 114 includes a body 144 and at least one gripper member 116. In some examples, the gripper 114 further includes a gripper arm 146 for extending the gripping members 116 outward from the body 144 of the gripper 110. The gripper 114 includes at least one gripping member 116 for holding, moving, coupling to, and/or inserting the wire 102 (see FIG. 1B). In some examples, the gripper 114 includes, for example, two gripping members 116 for holding a wire 102 therebetween, thus allowing a wire 102 to be positioned and/or inserted. In some examples, the gripping members 116 pinch the wire 102 in order to secure the wire and enable the gripper to direct the motion of the wire 102. The gripper may comprise a metal material, a rubber material, a plastic material, or any other suitable material for wire handling.

The wire insertion system further includes a first vibrating element 118. As shown in FIG. 1A, the first vibrating element 118 is coupled to the fixture 110. In some examples, however, the first vibrating element 118 is connected to one or more of the fixture 110, the gripper 114, grommet 106, and/or the dielectric 108 cavity. In some examples the first vibrating element 118 is an eccentric vibrating motor. In some examples the first vibrating element 118 is a piezoelectric device. In certain examples, the first vibrating element 118 is coupled to the fixture 110 via a connection mechanism, such as a nut and bolt connection or a screw connection. In other examples, the first vibrating element 118 is coupled to the gripper 114 via a connection mechanism, such as a nut and bolt connection or a screw connection. The first vibrating element 118 provides vibratory motion. In some examples, the first vibrating element 118 provides vibratory motion within the plane of the direction of insertion. In some examples, the first vibrating element 118 provides vibratory motion in the plane orthogonal to the direction of wire insertion, thus enabling the cavities for wire insertion to effectively shift position during insertion. In other examples, the first vibrating element 118 provides vibratory motion parallel to the direction of insertion of the wire, and/or provides vibratory motion in a random direction. It is contemplated, however, that vibratory motion may be provided in any direction and/or combination of directions. As utilized through this disclosure, vibratory motion includes vibrating and vice versa. Vibrating includes moving or causing movement continuously.

The wire insertion system 100 further includes a sensor 120. The sensor 120 is coupled to the fixture 110. In some examples, the sensor 120 is an accelerometer. In some examples, the sensor 120 may be coupled to the fixture 110 to optimize the vibratory motion. For example, as wires continue to be added to system via insertion into a respective grommet 106 and/or dielectric 108, each added wire increases the overall weight of the system. The added weight causes the relative vibratory motion provided by the first vibrating element 118 to increase or decrease. As such, the sensor 120 may signal the first vibrating element 118 to increase or decrease vibration due to the amount of wire added to and/or removed from the grommet 106 and/or dielectric 108. A feedback loop may be provided between the sensor 120 and the first vibrating element 118 to optimize the vibratory motion and/or to optimize the vibration amplitude produced by the first vibrating element 118. Therefore, as wires continue to be added and/or removed, the sensor 120 can provide feedback to the first vibrating element 118 such that vibration produced therefrom is adjusted and/or optimized for subsequent wires to be inserted more easily. In one example, vibration is optimized by altering and/or adjusting the speed of the first vibrating element 118 and/or determining the direction of vibration which creates a greater amplitude, prior to changing the speed or direction of the first vibrating element 118. In some examples, a local maxima may be determined in order to optimize the vibration.

By way of example only, optimizing the vibratory motion may include measuring a change in the natural frequency as wires continue to be added. As such, the sensor 120 may measure the change in the natural frequency, thus allowing new wires to continuously be inserted thereafter, due to the change in vibration.

Additionally, in some examples, the sensor may measure a force with which a wire 102 is inserted into a respective grommet 106 and/or dielectric 108. If the force with which the wire 102 is inserted is too strong that the force may damage the wire 102, the contact 104, and/or the grommet 106 or dielectric 108. As such, the sensor may signal the gripper 114 to stop the insertion process and/or to retry the insertion process.

The wire insertion system 100 is controlled by a processor based system, such as a controller 122. The controller 122 includes a programmable central processing unit (CPU) 124 that is operable with a memory 126 and a mass storage device 128, an input control unit 130, and a graphical user interface (e.g., a display unit) (not shown), and includes power supplies, clocks, cache, input/output (I/O) circuits, and the like, coupled to the various components of the wire insertion system 100 to facilitate control of the ongoing wire insertion processes. The controller 122 also includes hardware for monitoring, measuring, and optimizing vibratory motion and/or the natural frequency of the wire insertion system 100 and/or its components.

To facilitate control of the wire insertion system 100 described above, the CPU 124 may be one of any form of general purpose computer processor that can be used in an industrial setting, such as a programmable logic controller (PLC), for controlling various sub-processors. The memory 126 is coupled to the CPU 124. The memory 126 is non-transitory and may be one or more of readily available memory such as random access memory (RAM), read only memory (ROM), floppy disk drive, hard disk, or any other form of digital storage, local or remote. Support circuits 132 are coupled to the CPU 124 for supporting the processor in a conventional manner. Measuring vibration, optimizing vibratory motion, and other processes are generally stored in the memory 126, typically as a software routine. The software routine may also be stored and/or executed by a second CPU (not shown) that is remotely located from the hardware being controlled by the CPU 124.

The memory 126 is in the form of a non-transitory computer-readable storage media that contains instructions, that when executed by the CPU 124, facilitates the operation of the wire insertion system 100. The instructions in the memory 126 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the examples (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

The controller 122 stores logic for controlling the first vibrating element 118, the gripper 114, and/or the sensor 120. The controller 122 is coupled to the sensor 120 and in communication with the first vibrating element 118 and/or the gripper 114. Furthermore, the controller 122 is configured to vibrate the first vibrating element 118 using signals from the sensor 120. Communication includes a wired and/or wireless connection. A wireless connection includes a connection via, for example, Bluetooth, near field communication (NFC) signal, radio frequency (RF) signal, Wi-Fi connection, and/or mobile personal area network, among others.

The controller 122 is configured to receive data from the first vibrating element 118, the fixture 110, and/or the wire insertion system 100. The controller 122 calculations a change in the vibrating provided to the wire insertion system 100, the fixture 110, and/or the gripper 114 and controls the first vibrating element 118 by adjusting and/or optimizing the vibrating motion therefrom to conform to the calculated optimized vibration and/or vibratory amplitude of the receptacle. In some examples, the controller 122 calculates a change in a natural frequency of the wire insertion system 100, the fixture 110, and/or the gripper 114 and controls the first vibrating element 118 by adjusting the vibrating motion therefrom to conform to the calculated natural frequency of the receptacle.

For example, the controller 122 may be configured to control functioning of each of the fixture 110, the gripper 114, the sensor 120, and/or the wire insertion system 100 during different operations of the wire insertion process. In some examples, the controller 122 comprises logic and/or is programmed to align a plurality of wires 102 held by the gripper 114 with respective cavities 140 in the grommet 106.

FIG. 1B schematically illustrates a perspective view of a receptacle 134 and a gripper 114 of the wire insertion system 100 of FIG. 1A. The fixture 110 is configured to support the receptacle 134. In some examples, the receptacle 134 is coupled to the fixture 110. In other examples, the receptacle 134 is coupled to a second fixture 136, as shown in FIG. 1B. The receptacle 134 includes a grommet 106 for receiving a plurality of wires 102 therein. The grommet 106 comprises a plastic material, an elastomeric material, a polymer material, a rubber material, and/or any other suitable material. The grommet 106 includes a plurality of cavities 140 disposed therein. Each cavity 140 is configured to receive and/or accept at least one wire 102. The receptacle 134 also includes a dielectric 108, as discussed infra with respect to FIG. 1C. The dielectric 108 is disposed behind the grommet 106, such that a wire 102 inserted into the grommet 106 must pass through the grommet 106 before reaching the dielectric 108. As such, the dielectric 108 receives and/or accepts the contact 104 of the wire.

In some examples, and as shown in FIG. 1B, the wire insertion system 100 may further include an optional second vibrating element 142. The second vibrating element 142 may be substantially similar to the first vibrating element 118, described supra. Although two vibrating elements are shown, it is contemplated that only one vibrating element, such as the first vibrating element 118, may be utilized. It is further contemplated, however, that any number of vibrating elements may be utilized. In some examples, the fixture 110 and the gripper 114 are each coupled to either the first vibrating element 118 and/or the second vibrating element 142. The controller 122, in addition to the above described connections and communications, is also in communication with the second vibrating element 142. Furthermore, the control 122 is also configured to vibrate the second vibrating element 142 using signals from the sensor 120. In some examples, the second vibrating element 142 is an eccentric vibrating motor. In some examples, the second vibrating element 142 is a piezoelectric device.

In certain examples, the second vibrating element 142 is coupled to the fixture 110 via a connection mechanism, such as a nut and bolt connection or a screw connection. In other examples, the second vibrating element 142 is coupled to the gripper 114 via a connection mechanism, such as a nut and bolt connection or a screw connection. In other examples, the second vibrating element 142 is coupled to the fixture 110 while the first vibrating element 118 is coupled to the gripper, or vice versa. The second vibrating element 142 provides vibratory motion. In some examples, the second vibrating element 142 provides vibratory motion within a plane of the direction of insertion. In some examples, the second vibrating element 142 provides vibratory motion in a plane orthogonal to the direction of wire insertion, thus enabling the cavities for wire insertion to effectively shift position during insertion. In other examples, the second vibrating element 142 provides vibratory motion parallel to the direction of insertion of the wire, provides vibratory motion in a random direction, and/or combinations thereof.

It is contemplated that the wire insertion system 100 shown in FIG. 1A and the receptacle 134 shown in FIG. 1B may be operatively connected in some examples, while in other examples the wire insertion system 100 and the receptacle are separate and distinct systems. In such an example, the wire insertion system 100 may be moveable and/or portable such that the wire insertion system 100 may be utilized with any receptacle at any location.

FIG. 1C schematically illustrates a cross-sectional view of a cavity 140 of the grommet 106 and dielectric 108 of the wire insertion system 100 of FIGS. 1A and 1B, according to one example. As shown, the cavity 140 through the grommet 106 and into the dielectric 108 are not aligned and an offset exists been the grommet 106 and the dielectric 108. This offset may be due to the manufacturing process and tolerance of the connectors. As shown, the gripper 114 grips a region of the wire 102 allowing the contact 104 to remain free. The region between where the gripper 114 grabs the wire 102 and the area where the contact 104 is crimped to the wire allows for movement of the contact during the insertion process. This area is shown as the compliant region 138 in FIG. 1C.

The wire 102 and the contact 104 together make up a wire assembly. As such, upon insertion of the wire assembly into the grommet 106 and/or dielectric 108, the wire assembly may fail to properly insert correctly into the dielectric 108. Vibrations from the first vibrating member 118, and in some examples the optional second vibrating member 142, assist with the wire assembly insertion into the grommet 106 and/or dielectric 108. Through the use of vibration, the static friction between the wire assembly, the grommet 106, and/or the dielectric is broken, thus permitting the wire assembly to pass through the grommet 106 with a greater degree of success and allow the contact 104 to be properly seated in the dielectric 108. Once the contact 104 has passed through the grommet 106, the vibration further aids the contact 104 in locating the centroid of the dielectric cavity.

Figure 2:
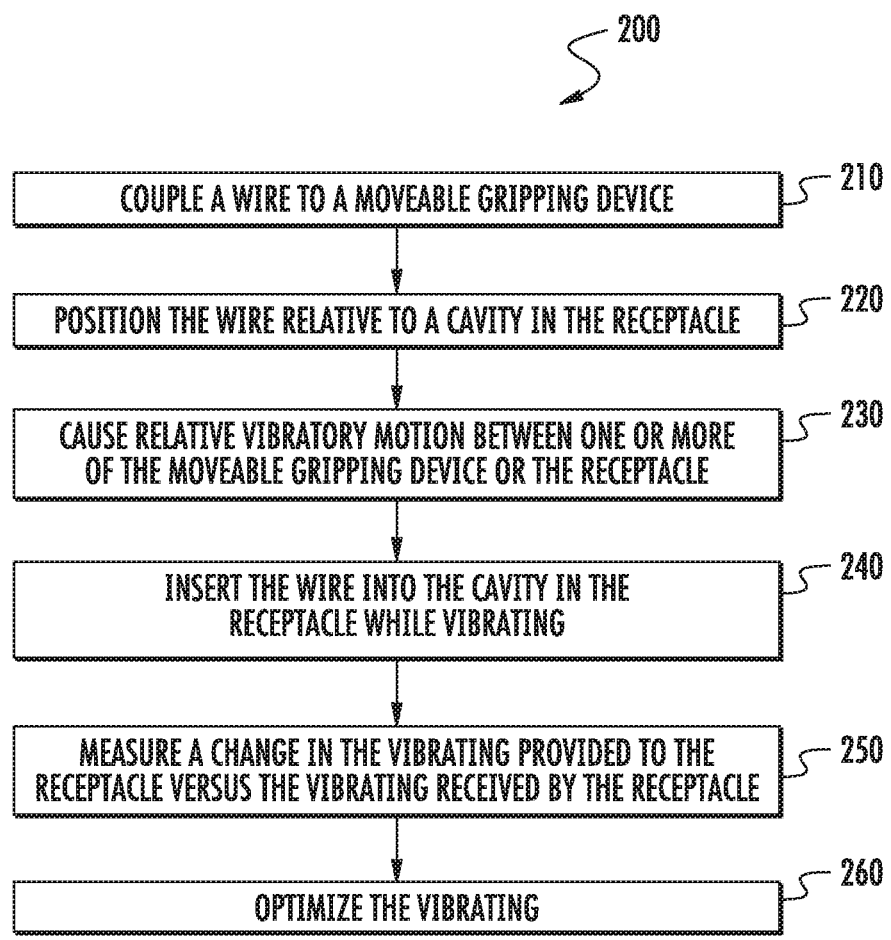
FIG. 2 is a flow chart illustrating operations of a method for inserting a wire into a receptacle, according to one example.

FIG. 2 schematically illustrates operations of a method for inserting a wire in a receptacle. In some embodiments, the receptacle includes a fixture, a base, a housing, a grommet, and/or a dielectric. At operation 210, a wire is coupled to a moveable gripping device. The moveable gripping device receives a wire by gripping the wire with one or more gripping members. The moveable gripping device grips the wire, without gripping the contact. As such, the moveable gripping device is positioned between about 0.01 inches and about 20 inches from the contact. In some examples, the gripper may grip the wire as close to the contact as possible without gripping the contact. By way of example only, in some examples, the grip of the gripper is maintained such that the gripper is continuously about 0.2 inches from the outer face of the grommet. It is contemplated, however, that in some examples the gripper and/or the gripping member may grip the contact of the wire.

At operation 220, the wire is positioned relative to a cavity in the receptacle. As such, the cavity is located and the wire is positioned. In some examples, the moveable gripping device moves and/or extends the wire towards a cavity in the grommet of the receptacle, such that the contact is positioned to be received by the receptacle.

At operation 230, one or more of the moveable gripping device, the wire, the grommet, the dielectric, and/or the receptacle is vibrated. In some examples, only the receptacle is vibrated, while in other examples only the gripper is vibrated, while in other examples the entire fixture is vibrated. Furthermore, in some examples, the grommet and/or dielectric may also be vibrated individually or along with other system components, discussed supra. Additionally, in some examples, the wire is vibrated directly. The vibration is one or more of vibrating in a motion perpendicular to the direction of insertion of the wire, vibrating in a motion orthogonal to the direction of insertion of the wire, vibrating in a motion parallel to the direction of insertion of the wire, vibrating in a circular direction relative to the longitudinal axis of the wire, and/or vibrating in a random motion. It is further contemplated, however, that in some examples the contact may be vibrated directly.

At operation 240, the wire is inserted into the cavity in the receptacle while vibrating. The vibrating may be occurring in any one or more of the moveable gripping device, the wire, the grommet, the dielectric, the cavity, and/or the receptacle, as described supra. The inserting includes holding the wire at a first location with the movable gripping device and connecting the wire with the cavity. Connecting the wire with the cavity includes inserting the wire via the moveable gripping device into the cavity. Once the wire is partially inserted into the cavity, the moveable gripping device releases the wire from the first location and moves away from the contact of the wire. As such, the inserting further includes gripping the wire at a second location, wherein the second location is a greater distance from the contact than the first location. The inserting further includes connecting the wire with the cavity such that the wire is frictionally coupled to the cavity.

At operation 250, a change in the vibration provided to the receptacle is measured versus the vibration received by the receptacle. In some examples, an accelerometer operatively connected to the receptacle is utilized to measure the change in the vibration as wires are inserted into the receptacle. In some examples, the vibration of the entire item being vibrated is measured and compared against a prior vibration provided before insertion of the wire. The difference between the vibrations measured results in the net change in the vibration. In some examples, the controller stores logic for determining and measuring the vibration.

By way of example only, measuring the change in the vibration may include measuring a change in the natural frequency of the receptacle. In some examples, the accelerometer, which is operatively connected to the receptacle, is utilized to measure the change in the natural frequency as wires are inserted into the receptacle. The natural frequency of the entire item being vibrated is measured and compared to a previously measured natural frequency prior to the insertion of the wire. The difference between the natural frequencies measures results in the change in the natural frequency. In some examples, the controller stores logic for determining and measuring the natural frequency.

At operation 260, vibration is optimized. As additional wires are coupled to the receptacle, additional weight is added to the receptacle. The additional weight may change the effect of and/or the strength of the vibration received by the receptacle thereby changing the vibration required to easily insert proximate wires. The change in the vibration required may increase the vibration or decrease the relative strength of the vibration provided. As such, the vibration is calibrated, optimized, and/or adjusted such that the wires may be easily inserted therein. By continuously optimizing the vibration, any number of wires may be inserted into a receptacle of any desirable size without regard to the weight of the wires. It is contemplated that optimizing the vibration may include optimizing the vibration amplitude. As discussed supra, in one example, vibration is optimized by altering the first and/or second vibratory element to produce higher or lower vibrations and/or determining which vibratory directions create the greatest amplitude. Furthermore, a local maxima may be located.

By way of example only, optimizing the vibration may include adjusting the vibration to approximately the natural frequency of the receptacle. As additional wires are coupled to the receptacle, additional weight is added to the receptacle. The additional weight may change the natural frequency of the receptacle thereby changing the vibration required. The change in the vibration required may increase the vibration or decrease the vibration. As such, the vibration is calibrated to the natural frequency of the receptacle and/or the entire system being vibrated. By continuously optimizing the natural frequency, any number of wires may be inserted in to a receptacle of any desirable size without regard to the weight of the wires.

The method 200 further includes repeating operations 210-260 until all wires of the system have been inserted.

Testing was completed using an eccentric rotating motor affixed to a fixture for on-machine testing. The vibration of the fixture was measured with a vibration measuring device. An insertion test was performed first without vibration as a control. The test was then repeated and completed with the vibrating element mounted to the fixture and insertion successes and failures were recorded. Results indicated that the vibrating trial maintained fewer wire insertion failures as compared to the non-vibrating test results. In fact, the vibrating trial indicated zero failed insertion attempts while the non-vibrating trial indicated an average of two or more failed attempts.

Further test results indicated that the force required to insert a wire into the receptacle including the grommet and dielectric was lowered with the use of vibration. As such, vibration increases the relative diameter of the cavity as seen by the contact and wire.

The subject matter described herein provides a vibrating mechanism that vibrates a wire insertion system or component thereof to enable cavities in a grommet and/or dielectric to effectively shift position during wire insertion relative to the contact of the wire. As such, wire insertion failure rates are reduced due to a number of factors. First, failure rates are reduced as constant vibration breaks static friction of the contact of the wire in the grommet or dielectric cavity. Static friction is highest when there is an insertion failure, and the manufacturing process pauses to retry in a slightly offset cavity position. Additionally, failure rates are reduced as vibration creates the positive locating required to insert the tip of the contact into the grommet cavity prior to inserting the wire fully into the grommet cavity. Furthermore, failure rates are reduced as vibration creates the positive locating necessary to insert the tip of the contact into the grommet cavity prior to inserting the wire fully into the dielectric cavity. Vibration helps to pivot the contact during the insertion process to properly and accurately seat the contact within the dielectric, therefore minimizing the use of the system retry feature. The flexible wire is held by the insertion gripper, while the contact is free to pivot about the edge of the grommet.

Furthermore, the subject matter described herein provides for a safer and automated work environment, a decrease in the number of tools required, a reduction in potential for foreign object damage to the wire and/or receptacle, thus reducing costs and improving safety, and a reduction in the probability of damage to components and surroundings.

It should be noted, while reference is made throughout the disclosure to a fixture or receptacle for wire insertion using vibration, it is contemplated that the present disclosure may be utilized for vibratory wire insertion or other mechanical and electrical needs with respect to various structures, components, parts, and system.

The descriptions of the various examples of the present invention have been presented for purposes of illustration, but are not intended to be exhaustive or limited to the examples disclosed. Many modifications and variations will be apparent to those of ordinary skill in the art without departing from the scope and spirit of the described examples. The terminology used herein was chosen to best explain the principles of the examples, the practical application or technical improvement over technologies found in the marketplace, or to enable others of ordinary skill in the art to understand the examples disclosed herein.

In the following, reference is made to examples presented in this disclosure. However, the scope of the present disclosure is not limited to specific described examples. Instead, any combination of the following features and elements, whether related to different examples or not, is contemplated to implement and practice contemplated examples. Furthermore, although examples disclosed herein may achieve advantages over other possible solutions or over the prior art, whether or not a particular advantage is achieved by a given example is not limiting of the scope of the present disclosure. Thus, the following aspects, features, examples and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to examples of the present invention, other and further examples of the invention may be devised without departing from the basic scope thereof, and the scope thereof is determined by the claims that follow.

What is claimed is:

1. A wire insertion system, comprising:
    a fixture;
    a first vibrating element connected to the fixture;
    a gripper adapted to interface with the fixture and to support a plurality of wires, comprising:
        a body;
        at least one gripping member coupled to the body; and
        a second vibrating element connected to the gripper;
    a sensor coupled to the fixture; and
    a controller coupled to the sensor and in communication with the first vibrating element, the second vibrating element, and the gripper, and configured to vibrate the first vibrating element and the second vibrating element using signals from the sensor.

2. The wire insertion system of claim 1, wherein the first vibrating element is an eccentric vibrating motor or a piezoelectric device.

3. The wire insertion system of claim 1, wherein the second vibrating element is an eccentric vibrating motor or a piezoelectric device.

4. The wire insertion system of claim 1, wherein the sensor is an accelerometer.

5. The wire insertion system of claim 1, wherein the fixture is configured to support a grommet having a plurality of cavities, each cavity configured to accept a respective wire of the plurality of wires.

6. The wire insertion system of claim 5, wherein the controller is programmed to align the respective wire with and in the respective cavity in the grommet.

* * * * *